United States Patent
Tsai et al.

(10) Patent No.: US 7,061,056 B2
(45) Date of Patent: Jun. 13, 2006

(54) HIGH $F_{MAX}$ DEEP SUBMICRON MOSFET

(75) Inventors: Chao-Chieh Tsai, Hsin-Chu (TW); Shyh-Chyi Wong, Taichung (TW); Chung-Long Chang, Dou-Liu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 138 days.

(21) Appl. No.: 10/623,907

(22) Filed: Jul. 18, 2003

(65) Prior Publication Data

US 2004/0018673 A1    Jan. 29, 2004

Related U.S. Application Data

(63) Continuation of application No. 09/932,730, filed on Aug. 20, 2001, now Pat. No. 6,613,623.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/382; 257/383; 257/384; 257/412; 257/411; 257/413

(58) Field of Classification Search ........ 257/382–384, 257/412–413
See application file for complete search history.

(56) References Cited

U.S. PATENT DOCUMENTS

| | | | | |
|---|---|---|---|---|
| 5,268,330 A | 12/1993 | Givens et al. | ............... | 437/195 |
| 5,554,544 A | 9/1996 | Hsu | ............... | 437/35 |
| 5,731,239 A | 3/1998 | Wong et al. | ............... | 438/296 |
| 5,739,066 A | 4/1998 | Pan | ............... | 438/595 |
| 5,943,560 A | 8/1999 | Chang et al. | ............... | 438/151 |
| 6,063,675 A | 5/2000 | Rodder | ............... | 438/291 |
| 6,137,175 A * | 10/2000 | Tabara | ............... | 257/750 |
| 6,376,351 B1 * | 4/2002 | Tsai | ............... | 438/592 |

* cited by examiner

*Primary Examiner*—Chuong A. Luu
(74) *Attorney, Agent, or Firm*—Thomas, Kayden, Horstemeyer & Risley

(57) ABSTRACT

A method of forming a high $f_{MAX}$ deep submicron MOSFET, comprising the following steps of. A substrate having a MOSFET formed thereon is provided. The MOSFET having a source and a drain and including a silicide portion over a gate electrode. A first ILD layer is formed over the substrate and the MOSFET. The first ILD layer is planarized to expose the silicide portion over the gate electrode. A metal gate portion is formed over the planarized first ILD layer and over the silicide portion over the gate electrode. The metal gate portion having a width substantially greater than the width of the silicide portion over the gate electrode. A second ILD layer is formed over the metal gate portion and the first ILD layer. A first metal contact is formed through the second ILD layer contacting the metal gate portion, and a second metal contact is formed through the second and first ILD layers contacting the drain completing the formation of the high $f_{MAX}$ deep submicron MOSFET. Whereby the width of the metal gate portion reduces $R_g$ and increases the $f_{MAX}$ of the high $f_{MAX}$ deep submicron MOSFET.

50 Claims, 5 Drawing Sheets

HIGH $F_{MAX}$ DEEP SUBMICRON MOSFET

This is a continuation of patent application Ser. No. 09/932,730, filing date Aug. 20, 2001 now U.S. Pat. No. 6,613,623, High Fmax Deep Submicron MOSFET, assigned to the same assignee as the present invention.

FIELD OF THE INVENTION

The present invention relates generally to semiconductor fabrication and more specifically to semiconductor MOSFET device fabrication.

BACKGROUND OF THE INVENTION

As MOSFET (metal oxide semiconductor field effect transistor) gate length decreases, the unit power gain frequency ($f_{MAX}$) degrades due to the up-scaling of parasitics.

U.S. Pat. No. 5,268,330 to Givens et al. describes a process for improving sheet resistance of an integrated circuit device gate.

U.S. Pat. No. 5,554,544 to Hsu describes a field edge method of manufacturing a T-gate LDD pocket device.

U.S. Pat. No. 5,739,066 to Pan describes a semiconductor processing method of forming a conductive gate or gate line over a substrate.

U.S. Pat. No. 6,063,675 to Rodder describes a method of forming a MOSFET using a disposable gate with a sidewall dielectric.

U.S. Pat. No. 5,943,560 to Chang et al. describes a method of fabricating a thin film transistor using ultrahigh vacuum chemical vapor deposition (UHV/CVD) and chemical mechanical polishing (CMP) systems.

U.S. Pat. No. 5,731,239 to Wong et al. describes a method of fabricating self-aligned silicide narrow gate electrodes for field effect transistors (FET) having low sheet resistance.

SUMMARY OF THE INVENTION

Accordingly, it is an object of one or more embodiments of the present invention to provide an improved method of fabricating high $f_{MAX}$ deep submicron MOSFETs.

Other objects will appear hereinafter.

It has now been discovered that the above and other objects of the present invention may be accomplished in the following manner. Specifically, a substrate having a MOSFET formed thereon is provided. The MOSFET having a source and a drain and including a silicide portion over a gate electrode. A first ILD layer is formed over the substrate and the MOSFET. The first ILD layer is planarized to expose the silicide portion over the gate electrode. A metal gate portion is formed over the planarized first ILD layer and over the silicide portion over the gate electrode. The metal gate portion having a width substantially greater than the width of the silicide portion over the gate electrode. A second ILD layer is formed over the metal gate portion and the first ILD layer. A first metal contact is formed through the second ILD layer contacting the metal gate portion, and a second metal contact is formed through the second and first ILD layers contacting the drain completing the formation of the high $f_{MAX}$ deep submicron MOSFET. Whereby the width of the metal gate portion reduces $R_g$ and increases the $f_{MAX}$ of the high $f_{MAX}$ deep submicron MOSFET.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
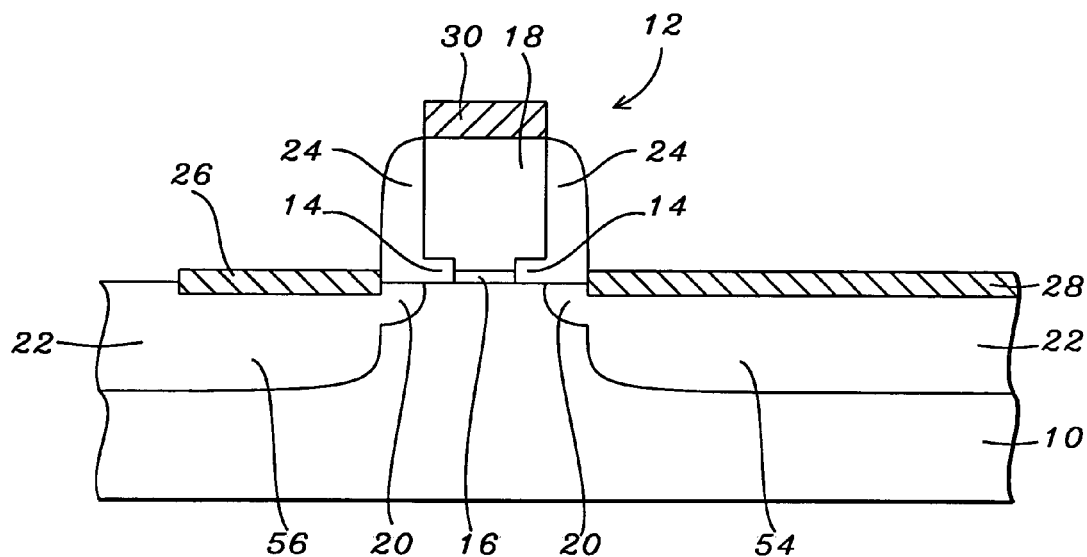
FIGS. 1 to 6 schematically illustrate, in cross-sectional view, a preferred embodiment of the present invention with FIG. 6 being of reduced size.

As shown in FIG. 1, substrate 10 is preferably a semiconductor substrate comprised of silicon and has formed thereon a low capacitance gate to drain ($C_{gd}$) metal oxide semiconductor field effect transistor (MOSFET) or a low $C_{gd}$ MOSFET 12. Preferably gate re-oxidation is used to form a smiling gate as at 14 to reduce both $C_{gd}$ and capacitance gate to source ($C_{gs}$) with the formula to calculate the unit power gain frequency ($f_{MAX}$) is:

$$f_{MAX} = f_T / ((R_s + R_g)/R_{out} + 2\pi f_T R_g C_{gd})^{0.5}$$

Where:

$f_{MAX}$=unit power gain frequency (the frequency where the maximum power gain of the transistor degrades to unity);
$f_T$=cut off frequency current gain;
$R_s$=resistance of source;
$R_g$=resistance of gate;
$R_{out}$=output resistance; and
$C_{gd}$=capacitance gate to drain.

Low $C_{gd}$ MOSFET/CMOSFET 12 includes: gate oxide 16 under gate electrode 18; LDD source/drain implants 20 and HDD source/drain implants 22 within substrate 10; sidewall spacers 24 adjacent the side walls of gate electrode 18; silicide portions 26, 28 over HDDs 22; and silicide portion 30 over gate electrode 18.

By using extra gate oxidation, the thickness of the gate oxide 16 near the drain and source region may be increased and therefore the parasitic capacitance $C_{gd}$ (capacitance between the gate and drain) can be reduced significantly. In this way, the $f_{max}$ of the RF MOSFET/CMOSFET can be improved.

Gate electrode 18 is preferably comprised of polysilicon. Sidewall spacers 24 are preferably comprised of silicon oxide. Silicide portions 26, 28; 30 are preferably comprised of $CoSi_x$, $CoSi_2$, or $TiSi_2$ and are more preferably comprised of $CoSi_2$.

The LDD implant 20 depth is preferably from about 100 to 500 Å. The LDD ions are preferably P or As ions at an LDD ion concentration of preferably from about 1E14 to 1E15 ions/cm². The HDD implant 22 depth is preferably from about 200 to 900 Å. The HDD ions are preferably P or As ions at an LDD ion concentration of preferably from about 5E14 to 2E15 ions/cm².

Gate electrode 18 is: preferably from about 500 to 5000 Å wide, is more preferably from about 1000 to 3500 Å wide and is most preferably about 0.13 μm wide; and is preferably from about 1000 to 3000 Å high and is more preferably from about 1500 to 2200 Å high. Gate oxide 16 is preferably from about 15 to 21 Å thick and is more preferably from about 16 to 20 Å thick. Sidewall spacers 24 are preferably from about 500 to 1500 Å wide and are more preferably from about 700 to 900 Å wide. Silicide portion 30 over gate electrode 18 is preferably from about 270 to 330 Å thick, is more preferably from about 290 to 310 Å thick and is most preferably about 300 Å thick.

ILD 1 Layer 34 Deposition

Figure 2:
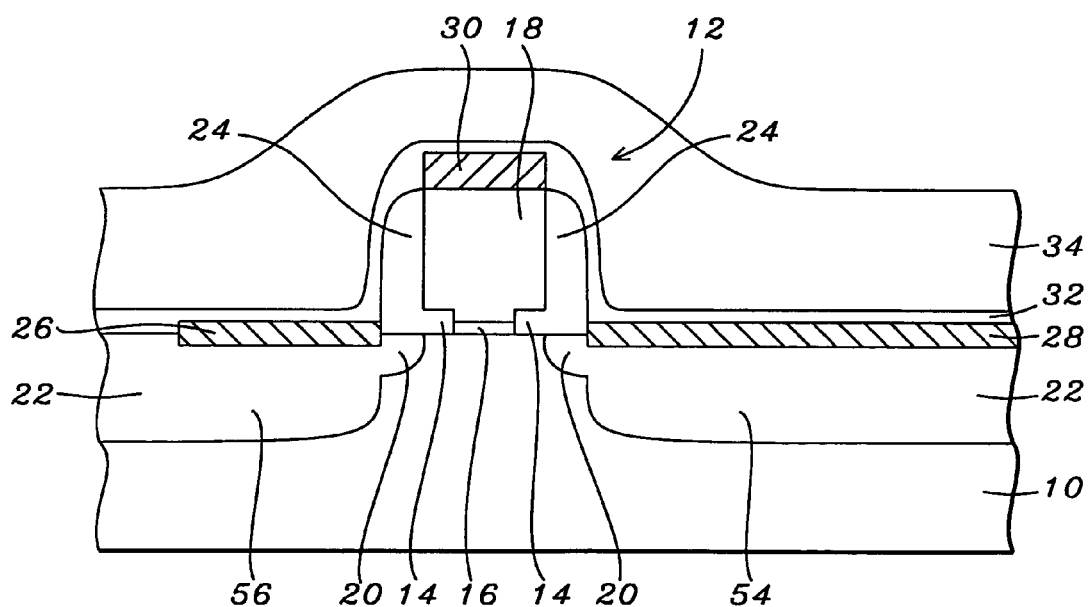

As shown in FIG. 2, dielectric layer 32 is preferably formed over the structure of FIG. 1 to a thickness of preferably from about 270 to 330 Å thick, more preferably from about 290 to 310 Å and most preferably about 300 Å thick. Layer 32 is less thick than like layers in previous such structures in which the thickness is about 1000 Å. The thinner dielectric layer 32 in the present invention makes is easier to remove it from over top of the gate 18/silicide portion 30 (see below).

Dielectric layer 32 is preferably formed of $Si_3N_4$, SiON, $SiO_2$ or TiN and is more preferably comprised of $Si_3N_4$ or SiON and aids in protection of the structure during further processing. Dielectric layer 32 will be hereafter referred to as $Si_3N_4$ layer 32 for the sake of brevity.

First inter-layer dielectric (ILD 1) layer 34 is then conventionally deposited over $Si_3N_4$ layer 32 to a thickness of preferably from about 2400 to 3000 Å and more preferably from about 2000 to 2200 Å. ILD 1 layer 34 is preferably comprised of oxide, silicon oxide, USG or TEOS and is more preferably comprised of silicon oxide.

ILD 1 layer 34 also aids in protection of the structure during further processing.

It is noted that for the normalized etching rate (ZT):
$ZT_{SiO2\ ILD\ 1\ layer\ 34}=1$;
$ZT_{Si3N4\ layer\ 32}=0.04$; and
$ZT_{CoSi2\ silicide\ layer\ 30}=0.02$.

It is desired to keep $CoSi_2$ silicide layer 30 during CMP.

Chemical-Mechanical Polish (CMP) of ILD 1 Layer 34 and $Si_3N_4$ Layer 32

Figure 3:
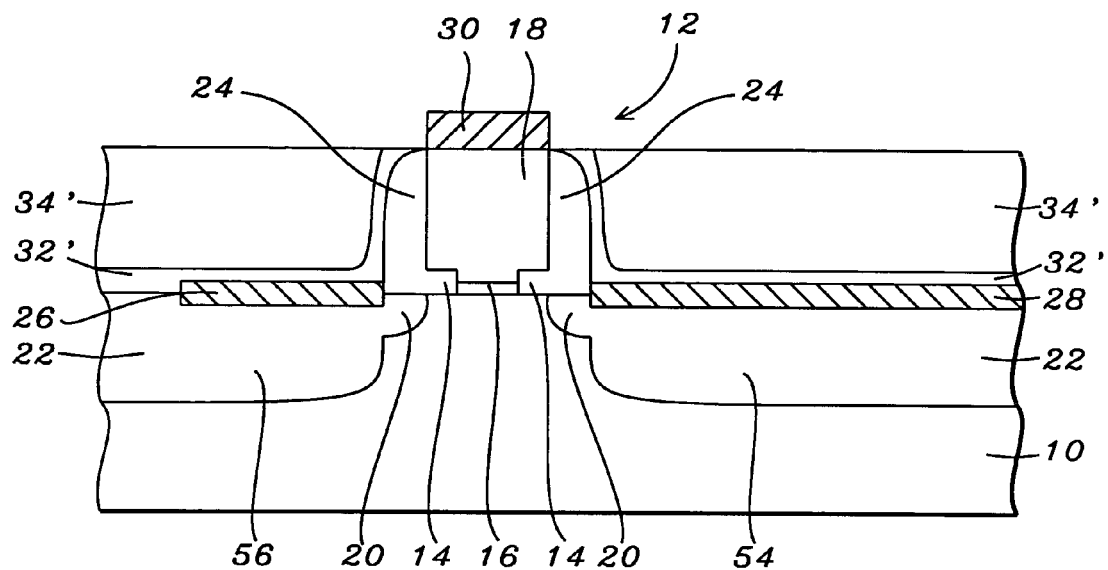

As shown in FIG. 3, ILD 1 layer 34 and $Si_3N_4$ layer 32 are removed in a two step process (ILD 1 layer 34 then $Si_3N_4$ layer 32) from over $CoSi_2$ silicide portion 30 over gate electrode 18, preferably by chemical-mechanical polishing (CMP), to form planarized ILD 1 layer 34' and partially removed $Si_3N_4$ layer 32'. Planarized ILD 1 layer 34' is substantially flush with the top of gate electrode 18 and has a thickness of preferably from about 1700 to 1900 Å, more preferably about 1800 Å.

It is noted that for the normalized etching rate (ZT):
$ZT_{SiO2\ ILD\ 1\ layer\ 34}=1$;
$ZT_{Si3N4\ layer\ 32}=0.04$; and
$ZT_{CoSi2\ silicide\ layer\ 30}=0.02$.

It is desired to keep $CoSi_2$ silicide layer 30 during CMP.

$CoSi_2$ silicide portion 30 serves as a stop layer to protect poly gate electrode 18 due to its high resistance to the CMP (see above), and $CoSi_2$ silicide portion 30 is left essentially exposed over poly gate electrode 18.

An $H_3PO_4$ solution may then be used to clean any remaining $Si_3N_4$ from over $CoSi_2$ silicide portion 30 over gate electrode 18.

$CoSi_2$ silicide portion 30 over poly gate electrode 18 also serves as adhesion and a barrier layer between the subsequently formed metal gate layer/portion 38 and poly gate electrode 18 (see below).

Metal Gate Portion 38 Formation

Figure 4:
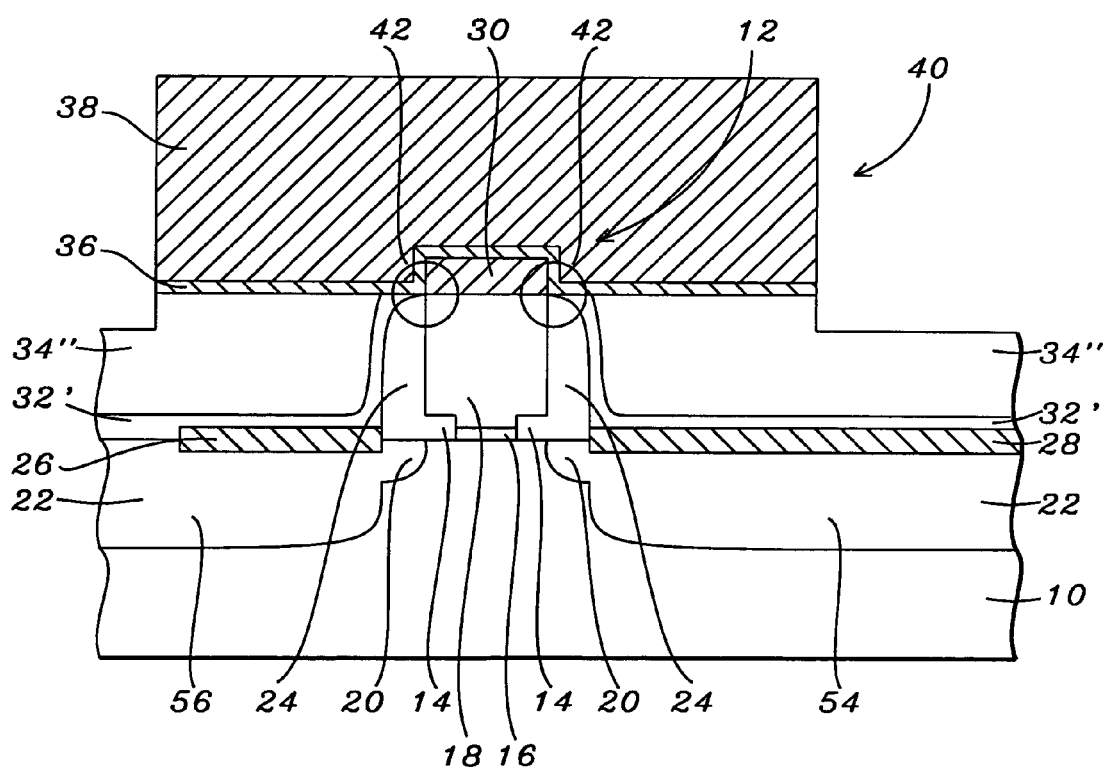

As shown in FIG. 4, a barrier layer 36 is preferably formed over planarized ILD 1 layer 34', the exposed portions of partially removed $Si_3N_4$ layer 32' and $CoSi_2$ silicide portion 30 overlying poly gate electrode 18. Barrier layer 36 is preferably comprised of TiN. Barrier layer 36 has a thickness of preferably of from about 100 to 300 Å and more preferably from about 150 to 200 Å.

In a key step of the invention, metal gate layer 38 is then is deposited over barrier layer 36 and metal gate layer 38, TiN barrier layer 36 and ILD 1 layer 34' are patterned to form the T-shaped metal gate portion/poly stack structure 40. The patterned may be done, for example, by forming a patterned photoresist layer (not shown) over unpatterned metal gate layer 38 and then etching metal gate layer 38, TiN barrier layer 36 and ILD 1 layer 34'. Metal gate portion 38 is wider than poly gate electrode 18 and $CoSi_2$ silicide portion 30 overlying poly gate electrode 18.

Metal gate layer/portion 38 is preferably comprised of tungsten (W), aluminum (Al), copper (Cu), titanium nitride (TiN) or gold (Au) and is more preferably comprised of W.

Metal gate layer/portion 38 has a thickness of preferably from about 1800 to 2200 Å, more preferably from about 1900 to 2100 Å and most preferably about 2000 Å.

In a key feature of the present invention, patterned metal gate portion 38 has a width appreciably greater that the width of $CoSi_2$ silicide portion 30 capping poly gate electrode 18. The width of W metal gate portion 38 is preferably from about 500 to 8000 Å, more preferably from about 1000 to 3000 Å and most preferably from about 1800 to 2400 Å.

This wider W metal gate portion 38 results in a much lower $R_g$ (resistance of gate) to increase $f_{MAX}$ (unit power gain frequency) [recalling the formula $f_{MAX}=f_T/((R_s+R_g)/R_{out}+2\pi f_T R_g C_{gd})^{0.5}$]. Further, the wider W metal gate portion 38 will not create an alignment problem between the metal to poly layers, i.e. the subsequently formed contact 50 (see below) to W metal gate portion 38 will more easily align to W metal gate portion 38 due to its increased width.

Schottky Contact 42

It is noted that the polysilicon gate electrode 18 contact 42 to $CoSi_2$ silicide portion 30 and W metal gate portion 38 is a Schottky contact and does not pose a serious leakage problem.

ILD 2 Layer 44 Deposition

Figure 5:
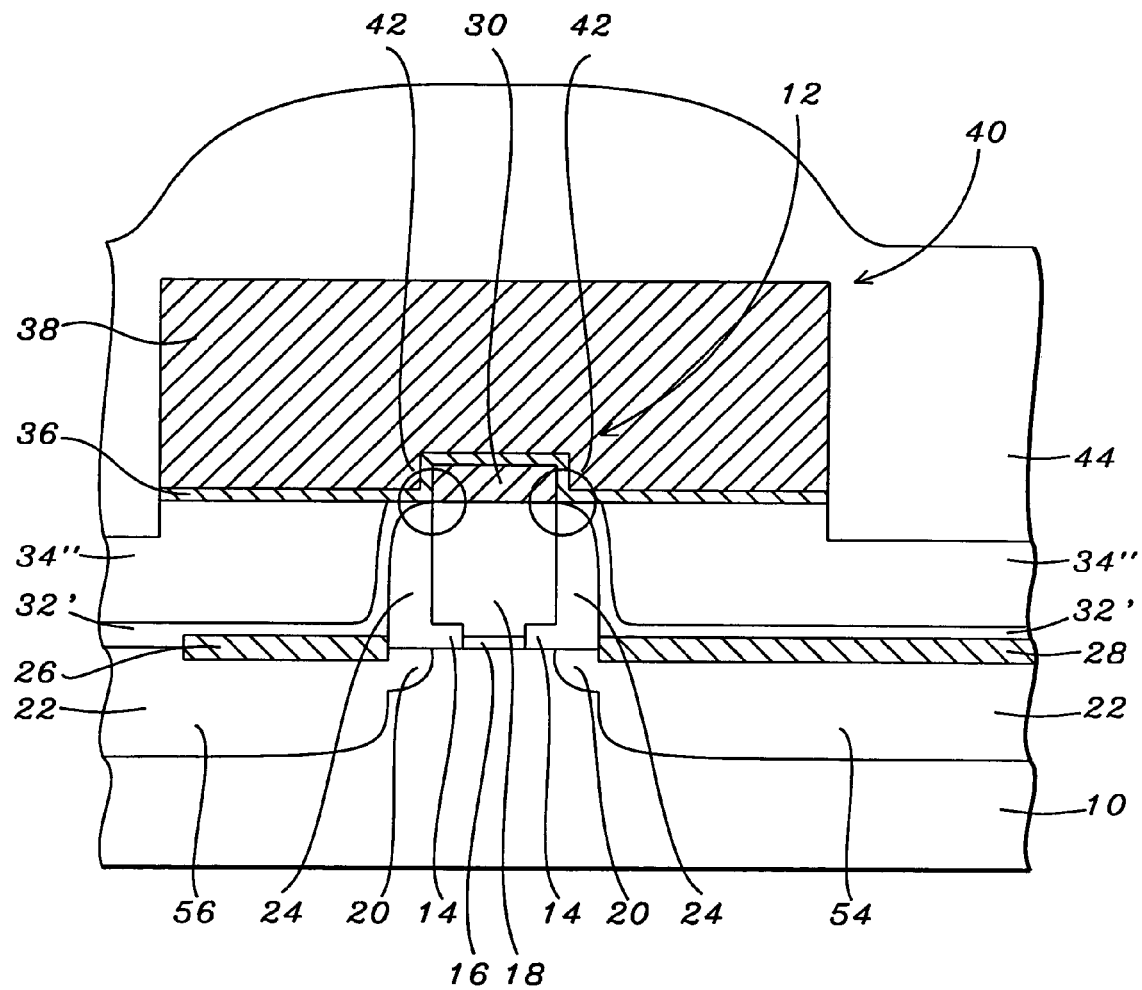

As shown in FIG. 5, second inter-layer dielectric (ILD 2) layer 44 is then deposited over the structure, covering T-shaped metal gate portion/poly stack structure 40, to a thickness of preferably from about 1000 to 5000 Å, more preferably from about 2000 to 4000 Å and most preferably from about 2500 to 3500 Å. ILD 2 layer 44 is preferably comprised of oxide, silicon oxide, HDP or FSG and is more preferably comprised of silicon oxide.

Due to the very thick dielectrics, i.e. ILD 1 layer 34 and ILD 2 layer 44, the increase in Cgd (capacitance gate to drain) is negligible and does not appreciably increase $f_{MAX}$ [again recalling the formula $f_{MAX}=f_T/((R_s+R_g)/R_{out}+2\pi f_T R_g C_{gd})^{0.5}$].

Formation of Metal Contacts 50, 52

Figure 6:
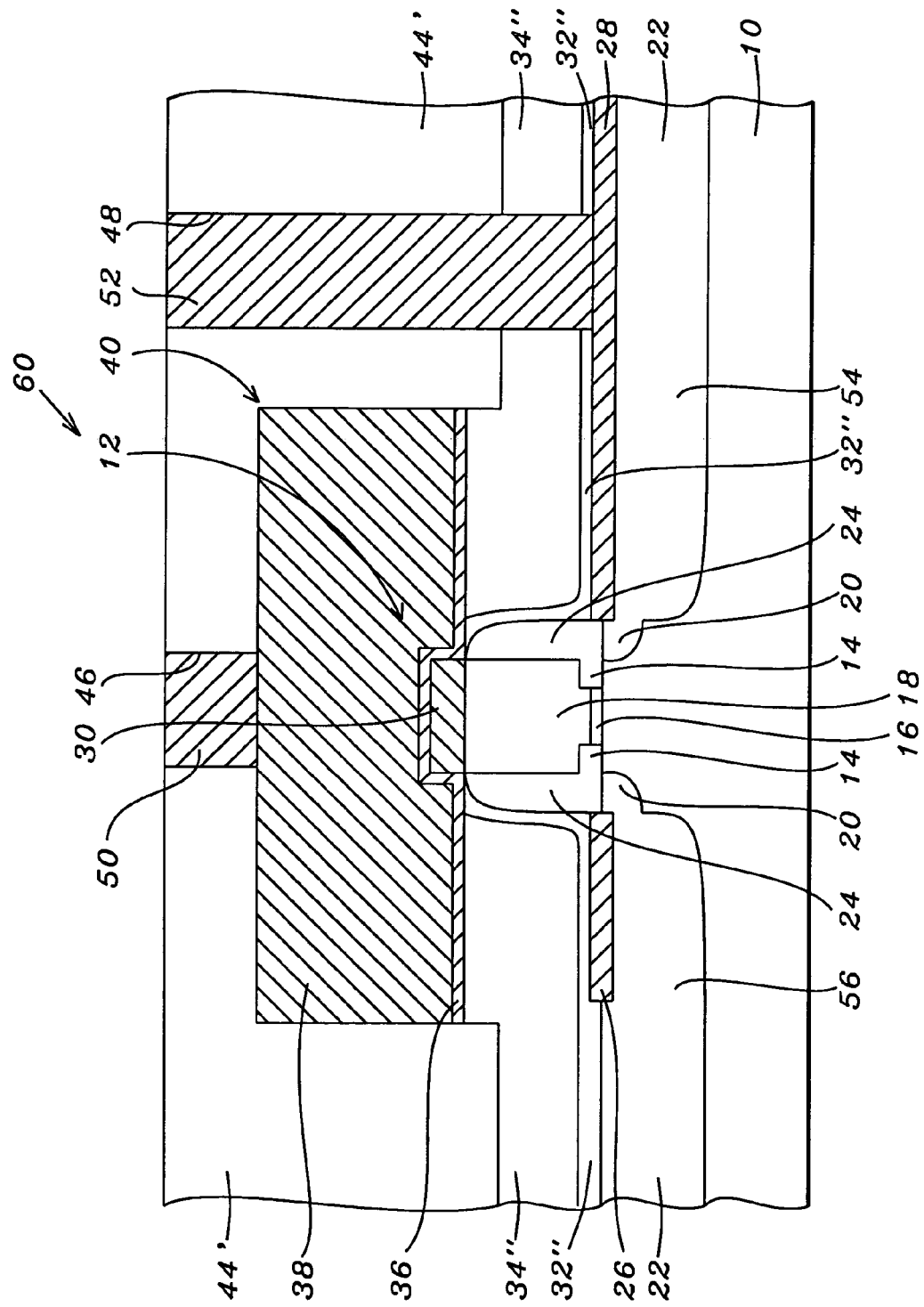

As shown in FIG. 6, ILD 2 layer 44 is planarized to form planarized ILD 2 layer 44'. Planarized ILD 2 layer 44' is patterned to form: first contact trench 46 through planarized ILD 2 layer 44' exposing a portion of W metal gate portion 38; and second contact trench 48 through planarized ILD 2 layer 44', planarized ILD 1 layer 34" and partially removed Si₃N₄ layer 32' exposing a portion of silicide portion 28 over drain 54.

First contact trench 46 is preferably from about 1500 to 3000 Å wide; is more preferably from about 1600 to 2800 Å wide and is most preferably from about 1700 to 2000 Å wide. Second contact trench 48 is preferably from about 1500 to 3000 Å wide; is more preferably from about 1000 to 2500 Å wide and is most preferably from about 1600 to 2000 Å wide.

A metal layer is then deposited over the structure, filling first and second contact openings 46, 48. The metal layer is planarized to remove the excess metal from over the patterned ILD 2 layer 44' forming first metal contact 50 within first contact trench 46 contacting W metal gate portion 38 and second metal contact 52 within second contact trench 48 contacting silicide portion 28 over drain 54 to complete the high $f_{MAX}$ deep submicron MOSFET device 60 of the present invention.

First and second metal contacts 50, 52 are preferably comprised of tungsten (W) or Cu and are more preferably comprised of W.

Figure 7:
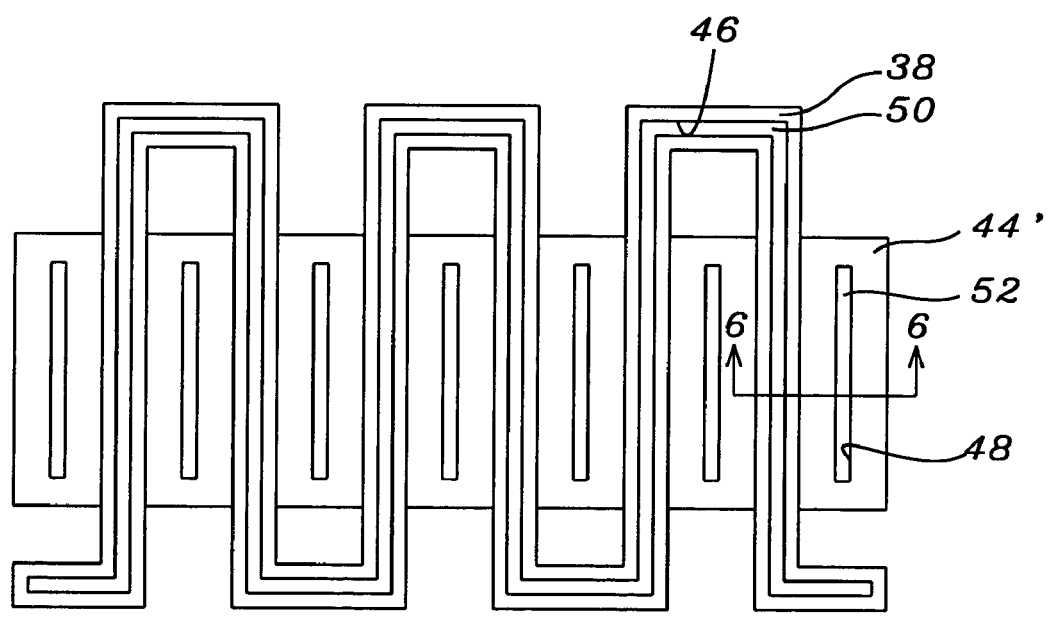
FIG. 7 is a plan view of a structure formed in accordance with a preferred embodiment and includes the structure of FIG. 6 taken along line 6—6.

FIG. 7 is a plan view of a structure formed in accordance with a preferred embodiment and includes the structure of FIG. 6 taken along line 6—6, i.e. FIG. 6 is a cross-sectional view of FIG. 7 taken along line 6—6. A 0.16×0.16 μm contact will give a contact resistance (Rc) of greater than about 17 Ohm. A wider W metal stack gate (W metal gate portion 38/TiN metal barrier layer 36' et al.) provides enough room to open first contact trench 46 on top of W metal gate portion 38, i.e. alignment problems are essentially eliminated. This can significantly reduce Rc while increasing $f_T$ and $f_{MAX}$ [once again recalling the formula $f_{MAX}=f_T/((R_s+R_g)/R_{out}+2\pi f_T R_g C_{gd})^{0.5}$].

Advantages of the Present Invention

The advantages of one or more embodiments of the present invention include:
1. reduced gate noise of the RF MOSFET;
2. reduced gate resistance ($R_g$), resulting in a high maximum oscillation frequency;
3. a designer may select a longer unit electrode length than in the conventional method where the designer was forced to use a very short electrode length to reduce the gate resistance;
4. by using extra gate oxidation, the thickness of the gate oxide near the source and drain region can be increased so that the parasitic capacitance ($C_{gd}$) (the capacitance between the gate and drain) can be significantly reduced in which case the $f_{max}$ of the RF MOSFET/CMOSFET can be improved.

While particular embodiments of the present invention have been illustrated and described, it is not intended to limit the invention, except as defined by the following claims.

We claim:

1. A high $f_{Max}$ deep submicron MOSFET structure, comprising:
   a substrate;
   a MOSFET on the substrate; the MOSFET having a source and a drain and including a silicide portion over a gate electrode;
   a first ILD layer over the substrate and the MOSFET wherein the silicide portion over the gate electrode is exposed and the first ILD layer is substantially flush with a top of the gate electrode;
   a metal gate portion:
      over the first ILD layer; and
      over the silicide portion over the gate electrode;
      the metal gate portion having a width substantially greater than the width of the silicide portion over the gate electrode;
   a second ILD layer over the metal gate portion and the first ILD layer;
   a first metal contact through the second ILD layer contacting the metal gate portion; and
   a second metal contact through the second and first ILD layers contacting the drain completing the formation of the high $f_{MAX}$ deep submicron MOSFET structure;
   whereby the width of the metal gate portion reduces $R_g$ and increases the $f_{MAX}$ of the high $f_{MAX}$ deep submicron MOSFET structure.

2. The structure of claim 1, including a dielectric layer:
   over the substrate and MOSFET but not over the silicide portion over the gate electrode; and
   under the first ILD layer.

3. The structure of claim 1, including a dielectric layer:
   over the substrate and MOSFET but not over the silicide portion over the gate electrode; and
   between the first ILD layer;
   the dielectric layer being comprised of Si₃N₄ or SiON.

4. The structure of claim 1, wherein the gate electrode is comprised of polysilicon; the silicide portion over the gate electrode is comprised of CoSix, CoSi₂, or TiSi₂; the first ILD layer is comprised of oxide, silicon oxide, USG or TEOS; the metal gate portion is comprised of W, Al, Cu, TiN or Au; the second ILD is comprised of oxide, silicon oxide, HDP or FSG; and the first and second metal contacts are each comprised of W or Cu.

5. The structure of claim 1, wherein the gate electrode is comprised of polysilicon; the silicide portion over the gate electrode is comprised of CoSix; the first ILD layer is comprised of silicon oxide; the metal gate portion is comprised of tungsten; the second ILD is comprised of silicon oxide; and the first and second metal contacts each being comprised of tungsten.

6. The structure of claim 1, wherein the gate electrode has a width of from about 500 to 5000 Å and the metal gate portion has a width of from about 500 to 8000 Å.

7. The structure of claim 1, wherein the gate electrode has a width of from about 1000 to 3500 Å and the metal gate portion has a width of from about 1000 to 3000 Å.

8. The structure of claim 1, wherein the gate electrode has a width of about 0.13 μm and the metal gate portion has a width of from about 1800 to 2400 Å.

9. The structure of claim 1, wherein the gate electrode has a height of from about 1000 to 3000 Å; the silicide portion over the gate electrode has a thickness of from about 270 to 330 Å; the first ILD layer has a thickness of from about 1700 to 1900 Å; and the metal gate portion has a thickness of from about 1800 to 2200 A.

10. The structure of claim 1, wherein the gate electrode has a height of from about 1500 to 2200 Å; the silicide portion over the gate electrode has a thickness of from about 290 to 310 Å; the first ILD layer has a thickness of about 1800 Å; and the metal gate portion has a thickness of from about 1900 to 2100 Å.

11. The structure of claim 1, wherein the gate electrode has a height of from about 1500 to 2200 Å; the silicide portion over the gate electrode has a thickness of about 300 Å; the first ILD layer has a thickness of about 1800 Å; and the metal gate portion has a thickness of about 2000 Å.

12. The structure of claim 1, wherein the MOSFET includes a source silicide portion over at least a portion of the source and a drain silicide portion over at least a portion the drain; and wherein the second metal contact contacts the drain silicide portion.

13. The structure of claim 1, wherein the MOSFET includes a source CoSix silicide portion over at least a portion of the source and a drain CoSix silicide portion over at least a portion of the drain; and wherein the second metal contact contacts the drain CoSix silicide portion.

14. The structure of claim 1, wherein the first ILD is planarized.

15. The structure of claim 1, wherein the high $F_{MAX}$ deep submicron MOSFET structure is positioned within an RF circuit.

16. The structure of claim 1, wherein the gate electrode has a gate oxide thereunder; the gate oxide having a thickness proximate the source and the drain to significantly reduce the parasitic capacitance and increase the $F_{MAX}$ of the high $f_{MAX}$ deep submicron MOSFET structure.

17. A high $F_{MAX}$ deep submicron MOSFET structure, comprising:
   a substrate;
   a MOSFET on the substrate; the MOSFET having a source and a drain and including a silicide portion over a gate electrode; the gate electrode having a width of from about 500 to 5000 Å;
   a first ILD layer over the substrate and the MOSFET wherein the silicide portion over the gate electrode is exposed and the first ILD layer is substantially flush with a top of the gate electrode;
   a metal gate portion:
      over the first ILD layer; and
      over the silicide portion over the gate electrode;
      the metal gate portion having a width of from about 500 to 8000 Å;
   a second ILD layer over the metal gate portion and the first ILD layer;
   a first metal contact through the second ILD layer contacting the metal gate portion; and
   a second metal contact through the second and first ILD layers contacting the drain completing the formation of the high $F_{MAX}$ deep submicron MOSFET structure;
   whereby the width of the metal gate portion reduces $R_g$ and increases the $f_{MAX}$ of the high $F_{MAX}$ deep submicron MOSFET structure.

18. The structure of claim 17, including a dielectric layer:
   over the substrate and MOSFET but not over the silicide portion over the gate electrode; and
   under the first ILD layer.

19. The structure of claim 17, including a dielectric layer:
   over the substrate and MOSFET but not over the silicide portion over the gate electrode; and
   between the first ILD layer;
   the dielectric layer being comprised of $Si_3N_4$ or SiON.

20. The structure of claim 17, wherein the gate electrode is comprised of polysilicon; the silicide portion over the gate electrode is comprised of CoSix, $CoSi_2$, or $TiSi_2$; the first ILD layer is comprised of oxide, silicon oxide, USG or TEOS; the metal gate portion is comprised of W, Al, Cu, TiN or Au; the second ILD is comprised of oxide, silicon oxide, HDP or FSG; and the first and second metal contacts are each comprised of W or Cu.

21. The structure of claim 17, wherein the gate electrode is comprised of polysilicon; the silicide portion over the gate electrode is comprised of CoSix; the first ILD layer is comprised of silicon oxide; the metal gate portion is comprised of tungsten; the second ILD is comprised of silicon oxide; and the first and second metal contacts each being comprised of tungsten.

22. The structure of claim 17, wherein the gate electrode has a width of from about 1000 to 3500 Å and the metal gate portion has a width of from about 1000 to 3000 Å.

23. The structure of claim 17, wherein the gate electrode has a width of about 0.13 µm and the metal gate portion has a width of from about 1800 to 2400 Å.

24. The structure of claim 17, wherein the gate electrode has a height of from about 1000 to 3000 Å; the silicide portion over the gate electrode has a thickness of from about 270 to 330 Å; the first ILD layer has a thickness of from about 1700 to 1900 Å; and the metal gate portion has a thickness of from about 1800 to 2200 Å.

25. The structure of claim 17, wherein the gate electrode has a height of from about 1500 to 2200 Å; the silicide portion over the gate electrode has a thickness of from about 290 to 310 Å; the first ILD layer has a thickness of about 1800 Å; and the metal gate portion has a thickness of from about 1900 to 2100 Å.

26. The structure of claim 17, wherein the gate electrode has a height of from about 1500 to 2200 Å; the silicide portion over the gate electrode has a thickness of about 300 Å; the first ILD layer has a thickness of about 1800 Å; and the metal gate portion has a thickness of about 2000 Å.

27. The structure of claim 17, wherein the MOSFET includes a source silicide portion over at least a portion of the source and a drain silicide portion over at least a portion of the drain; and wherein the second metal contact contacts the drain silicide portion.

28. The structure of claim 17, wherein the MOSFET includes a source CoSix silicide portion over at least a portion of the source and a drain CoSix silicide portion over at least a portion of the drain; and wherein the second metal contact contacts the drain CoSix silicide portion.

29. The structure of claim 17, wherein the high $F_{MAX}$ deep submicron MOSFET structure is positioned within an RF circuit.

30. The structure of claim 17, wherein the gate electrode has a gate oxide thereunder; the gate oxide having a thickness proximate the source and the drain to significantly reduce the parasitic capacitance and increase the $f_{MAX}$ of the high $f_{MAX}$ deep submicron MOSFET structure.

31. The structure of claim 17, wherein the first ILD is planarized.

32. A high $f_{MAX}$ deep submicron MOSFET structure, comprising:
   a substrate;
   a MOSFET on the substrate; the MOSFET having a source and a drain and including a silicide portion over a gate electrode;
   a first ILD layer over the substrate and the MOSFET wherein the silicide portion over the gate electrode is exposed and the first ILD layer is substantially flush with a top of the gate electrode;
   a metal gate portion:
      over the first ILD layer; and
      over the silicide portion over the gate electrode;
      the metal gate portion having a width substantially greater than the width of the silicide portion over the gate electrode;
   whereby the width of the metal gate portion reduces $R_g$ and increases the $f_{MAX}$ of the high $f_{MAX}$ deep submicron MOSFET structure.

33. The structure of claim 32, including a dielectric layer:
over the substrate and MOSFET but not over the silicide portion over the gate electrode; and
under the first ILD layer.

34. The structure of claim 32, including a dielectric layer:
over the substrate and MOSFET but not over the silicide portion over the gate electrode; and
between the first ILD layer;
the dielectric layer being comprised of $Si_3N_4$ or SiON.

35. The structure of claim 32, wherein the gate electrode is comprised of polysilicon; the silicide portion over the gate electrode is comprised of CoSix, $CoSi_2$, or $TiSi_2$; the first ILD layer is comprised of oxide, silicon oxide, USG or TEOS; the metal gate portion is comprised of W, Al, Cu, TiN or Au.

36. The structure of claim 32, wherein the gate electrode is comprised of polysilicon; the silicide portion over the gate electrode is comprised of CoSix; the first ILD layer is comprised of silicon oxide; the metal gate portion is comprised of tungsten.

37. The structure of claim 32, wherein the gate electrode has a width of from about 500 to 5000 Å and the metal gate portion has a width of from about 500 to 8000 Å.

38. The structure of claim 32, wherein the gate electrode has a width of from about 1000 to 3500 Å and the metal gate portion has a width of from about 1000 to 3000 Å.

39. The structure of claim 32, wherein the gate electrode has a width of about 0.13 μm and the metal gate portion has a width of from about 1800 to 2400 Å.

40. The structure of claim 32, wherein the gate electrode has a height of from about 1000 to 3000 Å; the silicide portion over the gate electrode has a thickness of from about 270 to 330 Å; the first ILD layer has a thickness of from about 1700 to 1900 Å; and the metal gate portion has a thickness of from about 1800 to 2200 Å.

41. The structure of claim 32, wherein the gate electrode has a height of from about 1500 to 2200 Å; the silicide portion over the gate electrode has a thickness of from about 290 to 310 Å; the first ILD layer has a thickness of about 1800 Å; and the metal gate portion has a thickness of from about 1900 to 2100 Å.

42. The structure of claim 32, wherein the gate electrode has a height of from about 1500 to 2200 Å; the silicide portion over the gate electrode has a thickness of about 300 Å; the first ILD layer has a thickness of about 1800 Å; and the metal gate portion has a thickness of about 2000 Å.

43. The structure of claim 32, wherein the MOSFET includes a source silicide portion over at least a portion of the source and a drain silicide portion over at least a portion of the drain.

44. The structure of claim 32, wherein the MOSFET includes a source CoSix silicide portion over at least a portion of the source and a drain CoSix silicide portion over at least a portion of the drain.

45. The structure of claim 32, wherein the first ILD is planarized.

46. The structure of claim 32, wherein the high $f_{MAX}$ deep submicron MOSFET structure is positioned within an RF circuit.

47. The structure of claim 32, wherein the gate electrode has a gate oxide thereunder;
the gate oxide having a thickness proximate the source and the drain to significantly reduce the parasitic capacitance and increase the $f_{MAX}$ of the high $f_{MAX}$ deep submicron MOSFET structure.

48. The structure of claim 32, further comprising:
a second ILD layer over the metal gate portion and the first ILD layer;
a first metal contact through the second ILD layer contacting the metal gate portion; and
a second metal contact through the second and first ILD layers contacting the drain completing the formation of the high $f_{MAX}$ deep submicron MOSFET structure.

49. The structure of claim 48, wherein the first metal contact is a trench contact.

50. The structure of claim 48, wherein the second metal contact is a trench contact.

* * * * *